United States Patent
Gubin et al.

[11] Patent Number: 6,057,556
[45] Date of Patent: May 2, 2000

[54] TUNNELING DEVICE AND METHOD OF PRODUCING A TUNNELING DEVICE

[75] Inventors: Sergei Pavlovich Gubin; Vladimir Vladimirovich Kolesov; Evgenii Sergeevich Soldatov; Artem Sergeevich Trifonov, all of Moscow; Vladimir Viktorovich Khanin, Moskovskaya obl.; Genadii Borisovich Khomutov; Sergei Aleksandrovich Yakovenko, both of Moscow, all of Russian Federation

[73] Assignee: Samsung Electronics Co., Ltd., Rep. of Korea

[21] Appl. No.: 08/973,355

[22] PCT Filed: Mar. 25, 1997

[86] PCT No.: PCT/RU97/00082

§ 371 Date: Feb. 2, 1998

§ 102(e) Date: Feb. 2, 1998

[87] PCT Pub. No.: WO97/36333

PCT Pub. Date: Oct. 2, 1997

[30] Foreign Application Priority Data

Mar. 26, 1996 [RU] Russian Federation ............ 96105544
Jun. 21, 1996 [RU] Russian Federation ............ 96112308

[51] Int. Cl.[7] .................................................. H01L 29/06
[52] U.S. Cl. ................................................ 257/39; 257/30
[58] Field of Search ...................................... 257/30, 39

[56] References Cited

U.S. PATENT DOCUMENTS

| | | | |
|---|---|---|---|
| 3,277,313 | 10/1966 | Underkofler | 257/39 |
| 4,286,275 | 8/1981 | Heiblum | 357/12 |
| 4,813,016 | 3/1989 | Okada et al. | 365/107 |
| 4,912,531 | 3/1990 | Reed et al. | 357/12 |
| 5,032,877 | 7/1991 | Bate | 357/12 |
| 5,079,179 | 1/1992 | Josefowicz et al. | 437/41 |
| 5,347,140 | 9/1994 | Hirai et al. | 257/17 |
| 5,731,598 | 3/1998 | Kado et al. | 257/30 |
| 5,844,279 | 12/1998 | Tanamoto et al. | 257/39 |

FOREIGN PATENT DOCUMENTS 0 469 243 A1  2/1992  European Pat. Off. .

OTHER PUBLICATIONS

International Search Report, Jul. 31, 1997.

*Primary Examiner*—Gene M. Munson
*Attorney, Agent, or Firm*—Myers Bigel Sibley & Sajovec

[57] ABSTRACT

The tunnel-effect device comprises an input electrode 3, an output electrode 4, and N control electrodes 5 separated with tunneling barriers, the latter barriers and the interbarrier space therein appear as an ordered structure of molecules and clusters establishing tunneling junctions; each control electrode 5 is located in the region of the ordered structure of molecules and clusters 2. The dimensions and properties of the molecules and clusters provide for single-electron correlated electron tunneling at a relatively high (room) temperature. The tunnel-effect device functions on the base of controlled correlated electron tunneling. Possibility of controlling the tunneling current opens the way to constructing various electronic gate circuits on the base of single-electron tunneling junctions and hence to preparing single-electron analog and digital devices, in particular, high-sensitivity sensors. The method for preparing the tunnel-effect device consists in establishing on the surface of a solid-state substrate an input electrode, an output electrode, and control electrodes, followed by formation of an inert dielectric molecular matrix with orderly built-in active molecules and clusters which are the localization centers of the tunneling electrons and thus establish single-electron tunneling junctions. The effect of discrete tunneling of individual current carriers through tunneling barriers at room temperature used in the tunnel-effect device may also be applied in a single-electron transistor and used for constructing single-electron gate circuits, wherein logical "1" and "0" are identified with the presence or absence of an electron.

30 Claims, 2 Drawing Sheets

TUNNELING DEVICE AND METHOD OF PRODUCING A TUNNELING DEVICE

TECHNICAL FIELD

The present invention relates in general to methods for producing functional elements of nanoelectronics and computer facilities, more specifically it concerns tunnel-effect devices and can find application for producing single-electron logic gates, single-electron memory circuits and sensors operable at room temperature.

BACKGROUND ART

Fundamentals of modern theory of correlated electronic tunneling have been elaborated as early as several years ago. A worldwide interest displayed in this new domain of physics and technology is concerned with the broadest potentialities and prospects offered by further research in single-electron phenomena and development of new promising technologies based thereon.

From the standpoint of physics the meaning of that phenomenon resides in electronic correlations due to Coulomb electrostatic interaction of electrons in diverse micro- and nano-scale structures. On the other hand, single-electronics is a route towards development of such electronic device that the operating concept of which is based on information coding by lone electrons.

One state-of-the-art three-lead (three-electrode) semiconductor device (U.S. Pat. No. 4,286,275) is known to comprise a combination of the base region having a physical size of the order of the length of a free path of the majority carrier, the emitter region which establishes a first barrier relative to the base region and featuring the barrier width sufficient for quantum-mechanical tunneling, and the collector base forming a lower barrier With respect to the base region than the first barrier and featuring the barrier width high enough to inhibit quantum-mechanical tunneling and ohmic contact with each of the emitter, base, and collector regions.

The three-lead (three-electrode) semiconductor device under discussion featuring a changeover time of about 10–12 s and offering a negative dynamic resistance, is created from a thin barrier region in the emitter section having a barrier height exceeding that in a wider barrier region of the collector section which separated by the base section having a width comparable with the length of the length of a free path of the majority carrier. The operation of the device is based on quantum-mechanical tunneling as the principal mechanism of electrical conduction through the base region to the collector region.

Field of application: amplification, changing-over, and establishing dynamic resistance.

Specific features: the collector barrier has such a width that tunneling current flowing therethrough is but negligible. Emitter-base junction: main conductance due to quantum-mechanical tunneling.

Dimensions: base—100 Å;
width of emitter barrier—80 Å;
width of collector barrier—120 to 150 Å.

The device discussed before is based on quantum-mechanical tunneling as the principal mechanism of electrical conduction from the emitter region to the base region, and of transferring hot major carriers through the base region to the collector region.

One more state-of-the-art three-lead (three-electrode) semiconductor device based on quantum wells (U.S. Pat. No. 4,912,531) is known to function as a MOS transistor. This means that in a general sense the three leads of the device may be considered as a source, a pass, and a drain. The output terminal communicates, by virtue of the tunneling effect, with a number of parallel circuits of quantum wells, each of which is adequately small for the energy levels therein to quantize discretely. In each of such pit circuits the second pit is connected to a second common conductor, while the first pit is electronically connected to a first common conductor.

A method for making GaAs-based electric elements of nanoelectronics and computer facilities with an insulating molecular Langmuir-Blodgett layer (U.S. Pat. No. 5,079,179) is known to comprise formation of an insulating layer appearing as Langmuir-Blodgett (LB) film interposed between a GaAs substrate and the conducting terminal.

The thickness of said layer is variable so as to set the functional characteristics of the device. The polar head group of a molecule of LB-film is so selected as to passivate the surface state of GaAs used as the substrate. There are found some preferable acid- and amino-groups or the polar head of molecules. It has been established that the LB-layer increases the height of the control barrier for a field-effect transistor and passivates broken bonds and surface flaws in the GaAs substrate, which makes possible inversion-mode operation. The method is applicable only for preparing macroscopic devices, i.e., field-effect transistor and diodes.

One of the most promising methods for making functional elements of nanoelectronics is a method for making an electronic device involving organic materials (EP #0469243), which provides for establishing of electronic devices, wherein electron current flows through an electrically conducting monomolecular or multi-monomolecular film.

Said method for making an electronic device involving organic material consists in establishing a first and a second electrodes on a substrate provided with an insulating film on its surface; etching out the insulating film using the first and second electrodes as a mask; forming a monomolecular or multi-monomolecular film, containing electrolytically polymerizable groups directly or indirectly on the substrate surface which functions as a third electrode; applying a voltage across the first and the second electrodes for the electrolytically polymerizable groups to polymerize; and withdrawing the third electrode from the substrate.

The aforediscussed method for making an organic electronic device is instrumental in forming a monomolecular or a multi-monomolecular film comprising electrolytically polymerizable groups, using the Langmuir-Blodgett technique. In addition, a possibility is provided for developing an electrode device involving an organic material, wherein formation of a monomolecular or a multi-monomolecular film containing polymerizable groups, involves the procedure of forming at least one layer of a monomolecular film by chemical adsorption of a silane-base surfactant, containing polymerizable unsaturated groups, from a nonaqueous organic solvent onto the substrate surface, followed by polymerization of the resultant film.

Furthermore, according to said method for making an electronic device, formation on the substrate surface of at least one layer of a monomolecular film containing electrolytically polymerizable unsaturated groups is followed by electrolytic polymerization of said unsaturated groups by applying an electric voltage across the first electrode and the second electrode in order to establish connection between the first and second electrodes through electrically conducting conjugated groups, while said silane-based surfactant is in fact a chemical substance containing a chlorosilyl group at its end.

An indispensable prerequisite for carrying said method into effect is that the monomolecular or multi-monomolecular films should contain electrically conducting conjugated groups, such as a polythienylene group, so that bonding between the first and second electrodes be effected by said polythienylene groups.

The known method for making an organic electronic device is featured by forming said first and second electrodes on a solid-state substrate, by an electrolytically polymerized monomolecular or multi-monomolecular layer interposed between said electrodes, and by establishing a third control electrode connected directly or indirectly to said monomolecular or multi-monomolecular layer, as well as to the first and second electrodes. Applying a voltage between the third and second electrodes allows of control over the electric current flowing between the first and second electrodes and depending on a change in the applied voltage.

In view of the foregoing, an inference can be made that the known method is instrumental in making electronic devices involving organic materials and utilizing the electron current flowing through an electrically conducting monomolecular or multi-monomolecular organic film.

The region through which electric current flows is established by conjugated links present in an organic material, specifically in said organic monomolecular or multi-monomolecular organic film, said links resulting from electrolytic polymerization of said film, whereby high functional capabilities and reduced overall dimensions of the device are attained.

It is due to the use of the chemical adsorption or LB-technique along with electrolytic polymerization that polymers having electrically conducting conjugated bonds may very efficiently be made on the concepts of self-organization, for electrically connecting two electrodes, with the result that highly perfect electronic organic devices may be obtained.

DISCLOSURE OF THE INVENTION

Therefore the principal object of the present invention is to provide an electronic device operating on the principle of a single-electron tunneling at a rather high (room) temperature.

It is common knowledge that mutual conductance of electrodes in a tunneling junction is rather low, i.e., much lower than the conductance of the tunneling junction itself. After tunneling of one electron the potential difference changes by the value $e/C$ (where $e=1.6.10-19$ F, C being the capacitance of the junction). Accordingly, a characteristic scale of change in the electrostatic energy of the system after tunneling of one electron is $e2/2C$.

Electrostatic energy of such a system is as follows:

$$E=Q2/2C; \quad Q=Qo+ne \text{ (e>0)}, \tag{1.1}$$

where $Q_0$ is a constant dependent upon the difference $\phi_1$ between work functions of the electrodes, $$Qo=C(\phi_1-\phi_2)/e \tag{1.2}$$

n is the number of electrons that passed through the junction.

The following two principal conditions should be met for attaining the tunneling effect of lone electrons:

1. The condition of a lowest value of thermal fluctuations with respect to electrostatic energy of the junction:

$$e2/2C>>kT, \tag{1.3}$$

where k is the Boltzmann constant;
T is temperature.

2. The condition of almost complete isolation of the object from the outside world. In this case a weak electron interchange is possible through the tunneling barrier. The condition of such an isolation has a simple quantitative sense, i.e., the value of tunneling resistance of the resultant junctions should be much higher than the so-called quantum resistance:

$$RQ=h/4e2-6.5 \text{ kOhm}, \tag{1.4}$$

where h is the Planck constant.

Meeting the condition of the Eqn. 1.4 provides for an inhibitory effect on quantum noise which manifests itself in random motion of electrons through the junction even at zero temperature when thermal noise is inhibited completely. In this case electrons will be localized on the object so that its charge will be determined, accordingly.

Thus, the effect of a lone electron tunneling can be observed when thermal (1.3) and quantum (1.4) charge fluctuations are relatively low compared with the energy of system recharging during tunneling.

It is demonstrable that when the junction electric charge Q is in the range of $-e/2<Q<e/2$, tunneling is disadvantageous for the system since its free energy increases in this case. Thus, when no potential difference is applied to the junction or such a difference is too low, no tunneling effect occurs. The phenomenon is called Coulomb blocking.

Now let Q change under, e.g., any source of current connected to the junction, i.e., $Q=I(t)$, so as to extend beyond one of the limits of the Coulomb blocking range and get somewhat in excess of $e/2$. As a result, the electron tunneling effect proves to energetically advantageous, whereby the junction charge changes to get a little higher than $-e/2$, that is, it falls again into the range of Coulomb blocking. That is why tunneling a next electron proves to be disadvantageous until an external recharging of the junction establishes the conditions of energetic advantage of a new tunneling action, i.e., till an increase in a complete junction charge on e. Thus, single-electron variations of the charge Q at the junction and those of the voltage $V=Q/C$ thereon will occur at a frequency $f=I/e$, where I denotes an average current passing through the junction. In this case electron tunneling in a single-electron tunneling junction is time-correlated.

In more complicated systems comprising a number of junctions, a strict space correlation of tunneling action in various junctions is possible. In case of two series-connected junctions, electron tunneling through one of these adds to the voltage and hence probability of tunneling through the other junction. Such a space correlation is most markedly pronounced when both of the junctions defer in resistance and hence in tunneling time most widely [1]. Thus, an average tunneling current flowing through the system is determined by the lower-resistance junction. The conditions for electron tunneling in both junctions can be varied by changing the charge on the central electrode externally, e.g., by inducing (or "injecting") through a high resistance (exceeding the quantum one), with the result that a single-electron transistor is obtained. A relation between current It and control voltage Vg with a fixed value of V is called the signal characteristic of a system. Said relation is essentially a periodic one having a period equal to an elementary charge: I(Q+e)=I(Q).

The theory of correlated single-electron tunneling holds true for junctions having adequately large electrodes whose energy spectrum may particularly be assumed as continuous. Of much interest is the point how characteristics of tunneling junctions change when the dimensions of said junctions are so reduced that space quantization of energy spectrum becomes substantial. No rigorous theory describing the effect of discreteness of energy spectrum on correlation process of single-electron tunneling through a very small metallic object (e.g., through a metal granule) or through a molecule (cluster) has so far been developed.

However, the assessments made [4] demonstrate that when an adequately high quantity of electrons are present on the object, the effect of discreteness of energy spectrum boils down to that under certain conditions the voltage-current characteristic may exhibit, apart from single-electron specific features, also the presence of a microstructure accounted for by a dimensional effect in space quantization of electron energy.

It is due to the method that a unique electronic device may be provided, operating on the single-electron tunneling mode at room temperature in an artificially created stable molecular structure.

BRIEF DESCRIPTION OF THE DRAWINGS

FIG. 1b is a side view of FIG. 1a, wherein:

1—substrate;
2—clusters and molecules built into a mono- or multi-monomolecular matrix;
3—input electrode;
4—output electrode;
5—control electrodes;

BEST MODE OF CARRYING OUT THE INVENTION

According to the proposed method for producing a tunnel-effect device, an ordered molecular structure is formed in a system of planar metal (or semiconductor) electrodes on a substrate, by mixing special molecules and clusters which provide formation of tunneling junctions and single-electron correlated electron tunneling in the device rather than a simple monolayer of inert molecules which forms a dielectric interlayer, i.e., a tunneling barrier.

Accordingly, when such molecules and clusters are fixed using the known Langmuir technique, a combined multicomponent layer is established on a water surface, said layer being constituted by amphiphilic molecules or clusters establishing single-electron tunneling junctions, whereupon the resultant multicomponent monomolecular layer is transferred from the water surface onto the substrate surface.

A method for establishing an ordered molecular structure satisfying the conditions of a single-electron correlated tunneling consists in the following: a combined layer of molecules and clusters 2 is deposited on a substrate 1 with prepared metal electrodes 3, 4, and 5, using a chemical adsorption or Langmuir-Blodget technique.

Organo-metallic clusters possess a set of properties unique for establishing molecular single-electron circuits for correlated tunnel transport, that is, the cluster nucleus consisting of but a few metal atoms has an electronic structure allowing of the presence of a variable number of additional electrons which, however, do not affect the atomic structure of the cluster. Typical of the cluster nucleus is the presence of closely positioned free electron levels, whereby a tunneling electron is enabled to rapidly pass, at a high temperature, from one level to another for a time shorter than an average time of electron tunneling onto the cluster nucleus. As a result, there is no quantum limitations of arrangement of a next tunneling electron, a feature that basically distinguishes the situation from resonance tunneling and is inherent just in systems considered in the theory of single-electron tunneling. It is worth emphasizing that the temperature in clusters having but a few metal electrons in their nucleus, at which the effects of electron quantizing as to the levels of electron structure of the nucleus become substantial, is much lower than the working temperature of a single-electron device.

An organic shell of a cluster is in fact a fixed tunneling barrier whose properties are independent of the presence of a tunneling electron. Characteristic dimensions of the cluster shell provide high tunneling penetrability and hence short tunneling time. In addition, tunneling resistance of a barrier is substantially higher than the quantum one (~6.5 kOhm), which is a fundamental requirement imposed by the theory of single-electron correlated tunneling.

There exists a wide selection of types of organo-metallic clusters featuring diverse combinations of types of the shell and nucleus, which makes it possible to vary both the parameters of the tunneling structure (i.e., effective capacitance and conductance) and merely chemical properties of the cluster shell which are important for its physicochemical fixing in a specific system, that is, the tunnel-effect device. Besides, operation in the mode of single-electron correlated tunneling is also possible in s system of other active molecules and clusters (other than organo-metallic) possessing the appropriate physicochemical properties, e.g., carboran, fulleren, etc. which can also be used for making the device.

Two principal problems are to be solved when producing a single-electron tunnel-effect device:

Selecting adequately stable active molecules or clusters possessing such properties that provide a single-electron transport of electrons;

Forming on a substrate an ordered structure from such molecules and clusters.

It is mainly due to its stability that a carboran cluster has been selected among a wide variety of the heretofore-known clusters. The carboran cluster having a characteristic size of about 15 A, hence a substrate whereon said cluster is to be arranged should feature a characteristic surface irregularity much less than 15 A. It is necessary that the cluster is held to the substrate stably; besides, the substrate should be electrically conducting. The aforementioned requirements are met by substrates made of highly oriented pyrolytic graphite due to their having adequately high conductance and a characteristic surface irregularity of about 1 Å, with the graphite lattice spacing equal to 2.46 Å.

To attain a reliable holding of molecules to the substrate use is made of the Langmuir-Blodgett technique. The Langmuir-Blodgett films are in effect single- or multilayer coatings constituted by amphiphilic molecules on a solid substrate, prepared by transferring one strictly monomolecular layer of molecules after another when the substrate passes through the surface of a water phase coated with a monolayer.

The structure of the molecular component of the present device is as follows: a combined film of stearic acid with carboran clusters incorporated thereinto is applied to an atomically smooth surface of pyrolytic graphite, using the LB technique, said film featuring the molecules of the clusters fixed on the substrate with the matrix of the stearic acid.

As far as the use of the effect of correlated electron tunneling for constructing nanoelectronics circuitry is concerned, of much importance is the problem of a possibility of controlling the tunneling current in such a double-junction structure, using an independent signal.

The following pattern is selected for constructing a single-electron transistor: a substrate-supported cluster is positioned near a control electrode insulated from the substrate, said electrode establishing a charge on the cluster by virtue of the field effect. Numerical assessment of the mutual capacitance or such electrode and cluster demonstrates that its value necessary for constructing said single-electron transistor can be attained when the spacing between the electrode and the cluster is not in excess of 100 nm. A voltage of the order of a few volts should be applied to the electrode in this case.

Actually, such a structure appears as a double-layer (dielectric-conductor) system of fine stripes evaporation-deposited upon the substrate which is made of a highly oriented pyrolytic graphite having a surface finish in a scale of the order of one hundred nanometers equalling the size of one cell of the graphite crystal lattice (2.46 Å). Used as the dielectric is $Al_2O_3$ and as the conductor, Au.

The system of such electrodes is prepared with the aid of the techniques of modern nanolithography. The configuration of the electrodes appears as a "comb" of a number (of the order of a hundred) of long narrow stripes. The interstripe spacing should be small enough so that the probability of a cluster to be near a stripe be adequately high. On the other hand, said spacing should be so large (of the order of a few hundreds of nanometers) that the needle of a scanning tunnel microscope may scan the surface. As a result of a compromise between these and other technological conditions the spacing between the neighboring electrodes is selected to be about 400 nm, the electrode width measuring alike.

The herein-proposed method for preparing a single-electron tunnel-effect device uses the developed technology of reliable fixing the clusters and molecules on the surface of a solid-state substrate. The gist of the adopted technology consists in incorporating the tunnel-active clusters and molecules into the matrix of Langmuir's film based on amphiphilic substances (e.g., stearic acid). The proposed technology provides for obtaining a monolayer structure of cluster molecules. The technology is based on research of the physicochemical properties multicomponent Langmuir's films containing nanoparticles. The matrix of the Langmuir's monolayer of a polymerized amphiphilic substance fixes reliably active clusters and molecules, thus preventing them from motion under the effect of an electric field of electrodes. For more reliable fixing of active clusters and molecules they are to be mixed with amphiphilic substances, e.g., stearic acid in such a ratio that each cluster and molecule be surrounded completely with the stearic acid molecules.

At present, it is the scanning tunnel microscopy and spectroscopy technique that proves to be the sole technique on registering the characteristics of lone structures having such minute dimensions, said technique making possible observation and studying the objects with atomic resolution.

For the purpose of demonstrating the functional capabilities of the proposed tunnel-effect device use is made of the scanning tunnel microscopy and spectroscopy (STS) technique. Use of a scanning tunnel microscope (STM) enables one to measure the characteristics of single-electron systems having arbitrarily small (down to the atom's) dimensions.

The construction of a scanning tunnel microscope is instrumental in obtaining a three-dimensional pattern representing the surface relief, and also make it possible to connect the desired objects to the needle-substrate circuit.

The direct-current mode is used for measurements. In said mode a direct tunneling current is maintained, while the respective position of the needle over the surface is maintained and fixed with the aid of a feedback circuit.

Figure 2:
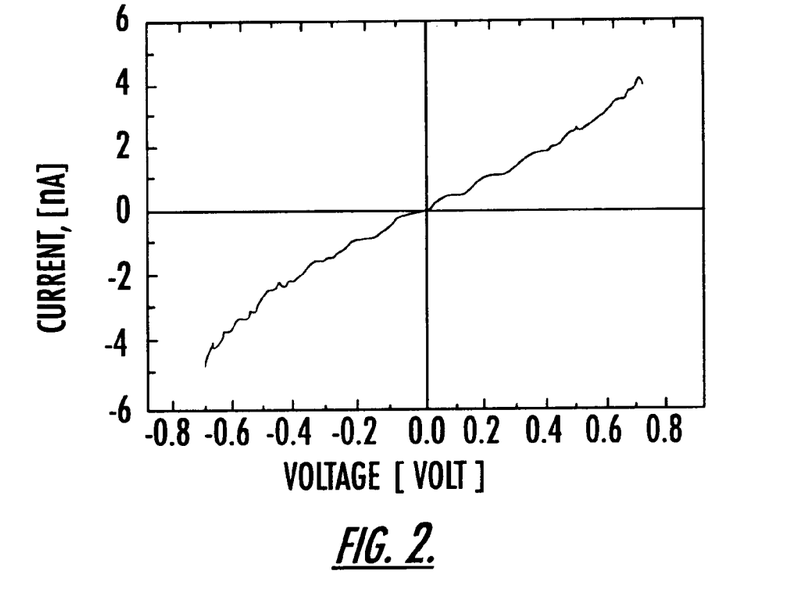
FIG. 2 shows a voltage-current characteristic of the tunnel-effect device.

For constructing the proposed tunnel-effect device use is made of metal-containing carboran clusters measuring about 20 Å. Use of such clusters as an active element enables one to observe single-electron phenomena in such a system at a temperature of liquid nitrogen (about 77 K) and at room temperature (about 300 K) (FIG.2).

Figure 1A:
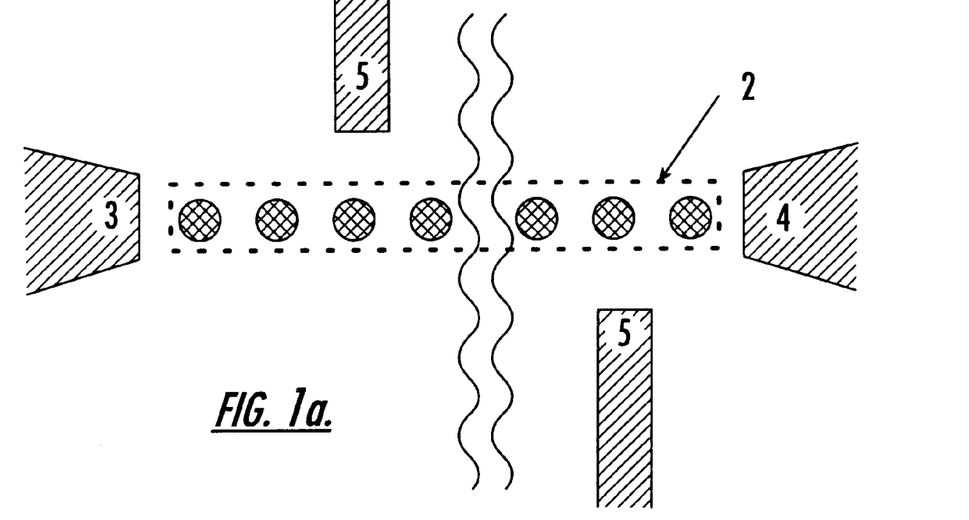
FIG. 1a is a plan view of a functional diagram of the tunnel-effect device, according to the method of the invention.
Figure 1B:
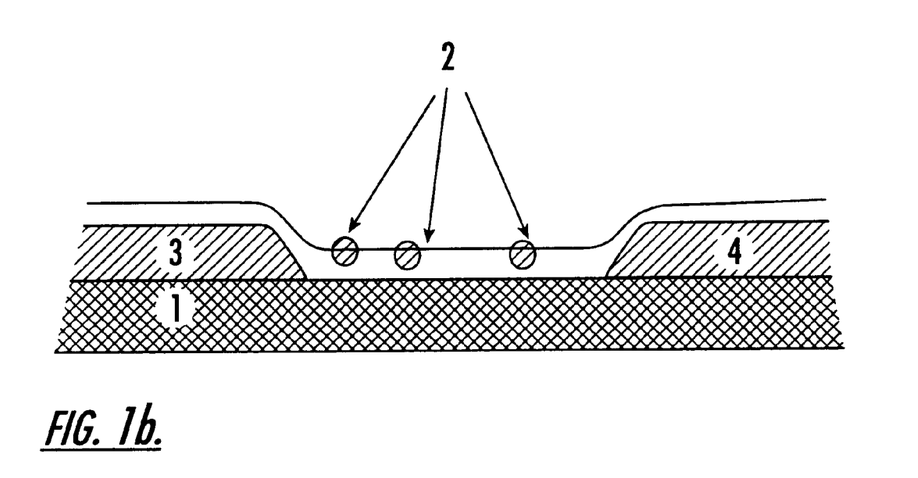

The "needle-cluster nucleus" and "cluster nucleus-substrate" junctions serve as the tunneling junctions in the single-electron STM-based transistor under construction. The charge $Q_o$ induced onto the cluster, using the field effect upon applying a voltage to the control electrode 3 (FIG. 1), modifies the conditions for current flowing through the system and functions as the control.

Clusters and cluster molecules differ from other organic and inorganic molecules in that they consist of a dense heavy nucleus featuring a symmetry, as a rule, approximating the spherical one, and surrounded with a ligand shell of light atoms or elementary molecules. A specific feature of the electronic structure of cluster molecules, i.e., the presence of a dense network of closely spaced highest occupied molecular orbitals and the respective lowest unoccupied molecular orbitals (both of them being as a rule weakly bonding), is responsible, on the one hand, for appearance in clusters multiple single-electron reversible junctions and, on the other hand, it imparts an adequate stability to the core of cluster molecules after adding or removing an electron.

Figure 3:
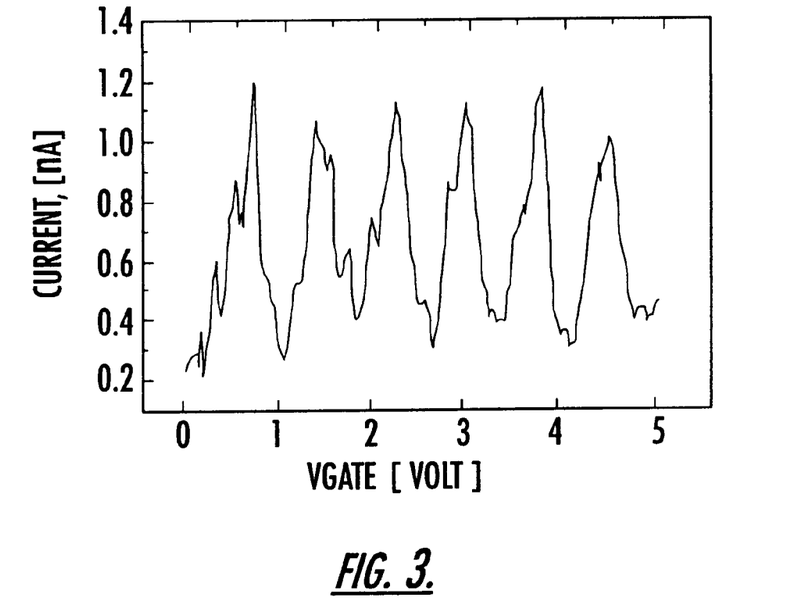
FIG. 3 presents a signal (control) characteristic of a tunnel-effect device with one control electrode (molecular single-electron transistor) at a temperature of 300 K showing the cluster located close to the control electrode.

According to the present invention, used as the active elements of the proposed tunnel-effect device which establish therein tunneling barriers and interbarrier space (the regions where tunneling electrons are localized) are the appropriate molecules and clusters (in particular, metal-containing molecular clusters) having the required characteristic dimensions (below 100 A) and capable to exhibiting the effect of Coulomb blocking of electron tunneling in an ordered structure of such molecules and clusters, without imposing any definite limitations upon the structure of the energy spectrum of electrons in such molecules and clusters. These molecules and clusters (a single molecule as a particular case), on which tunneling electrons are localized, are arranged in appropriately ordered manner in the space confined between the metal (or semiconductor) input, output, and control electrodes FIG. 1). In this case tunnel current flows on the input electrode 3 and the output electrode 4, while the control electrodes 5 provide for an efficient control over the tunnel current of electrons (FIG. 3), with the result that when the voltage on the control electrode 5 changes steadily, a periodic unsteady change in tunneling current is noticed. When the proposed device is used for preparing diverse sensors, tunneling current varies under some external effects, such as electromagnetic fields, interaction between the environmental components and the active region of the device (i.e., single-electron tunneling junctions). Spatial ordered stabilization of active molecules on which tunneling electrons are localized, is provided due to an ordered arrangement of said molecules in the matrix of a chemically inert substance, or by virtue of chemical bonds with the components of the device.

The proposed method is carried into effect as follows.

Use is made of the Langmuir-Blodgett technique for preparing a monomolecular layer of lone clusters fixed in an inert molecular matrix. The aforementioned technique is instrumental in establishing on the liquid phase surface monomolecular films of substance of a definite class, and in transferring said films onto a solid substrate.

In order to produce combined Langmuir's monolayers containing carboran clusters and stearic acid, there are prepared solutions of the cluster and of stearic acid in tetrahydrofuran, having a concentration of $10^{-3}$ M. Then both of the solutions are used for preparing therefrom solutions, containing stearic acid and carboran clusters in the following ratios: 1:32; 1:20; 1:16; 1:12, 1:8; 1:4; 1:1; 2:1; 4:1; 8:1; 12:1; 16;1; 20:1, 32:1, respectively. To establish a monolayer, a solution of stearic acid and/or carboran cluster in tetrahydrofuran is applied to the surface of a water subphase (pH=5.6), the concentration of said solution being $4 \cdot 10^{-4}$ M (in terms of a total number of the stearic acid molecules and of clusters). In 5 minutes required for the solvent to evaporate the monolayer is compressed at a rate of 3 Å² per molecule per minute. Before transferring the monolayer from the water surface onto the graphite substrate the monolayer is compressed with a movable barrier till a pressure of 25 mN/cm, whereupon said monolayer is transferred onto a freshly prepared spalled graphite surface at a rate of 0.5 mm/min, using the Scheffer technique. When transferring the monolayer onto the substrate a surface pressure of 25 mN/cm is maintained constant. In order to prepare a monolayer oriented with the hydrophobic tails outwards, the substrate is submerged in water before applying the monolayer to the water surface. When preparing a monolayer oriented with the hydrophilic tails outwards, once the substrate has been submerged in water completely, the monolayer is compressed to a maximum degree until a collapse occurs, whereupon the monolayer is sucked out with a water pump, and the bath area is increased to a maximum extent, after which the substrate is withdrawn from water.

With a view to elucidating the possibilities and specific feature of building carboran clusters into a Langmuir monolayer based on stearic acid, there have been studied the isotherms of compression of combined monolayers made of stearic acid and carboran clusters on the surface of deionized water (pH=5.6). Carboran clusters free from stearic acid molecules do not form stable Langmuir monolayers on water surface, and the surface pressure is not in excess of 3 mN/m in response to compression of the carboran "monolayer". When doped with stearic acid molecules (with stearic acid/cluster ratio k being within 0.6 and 12) carboran clusters establish stable amphiphilic monolayers displaying pronounced cooperative properties, i.e., the value $P_{max}$ of surface pressure equals 70 mN/m, whereas that of $P_{max}$ for stearic acid and carboran clusters per se equals 55 mN/m and 3 mN/m, respectively.

Thus, stable combined Langmuir monolayers of a pronounced cooperative nature have been prepared by incorporating nonamphiphilic molecules, i.e., carboran clusters into classic Langmuir monolayers of stearic acid.

In this case the active molecules and clusters themselves might not form LB films altogether. That is why use is made of combined LB films of fatty acids with cluster molecules built thereinto, since said acids are well studied and are convenient for application. Thus, the problem of selecting the type of clusters usable in single-electron electronics has been separated from that of fixing the selected clusters on substrate, and both of the problems have been solved. A novel aspect of the present invention resides in that a combined film of a fatty acid and clusters is prepared on water surface, whereupon said film is transferred onto a substrate. With a definite concentration of cluster molecules in LB film they form their own ordered structure.

When measuring voltage-current characteristics and spectrum (i.e., the analog derivative of voltage-current characteristic with respect to voltage) of a monomolecular layer of stearic acid with clusters incorporated thereinto, using STM at a temperature of 300 K, some peculiarities of voltage-current characteristics have been found, which agree well with the data of the existing theory of single-electron tunneling. Thereby an experimental evidence has been obtained of a stable reproducible realization of a single-electron tunneling at room temperature in an artificially established stable molecular structure.

Measurements taken at room temperature demonstrate that current flowing through the transistor molecular tunneling structure "STM needle-cluster-substrate" at a fixed working point, depends unsteadily, and moreover, periodically on a steady voltage variation on the control electrode. Thus, there is found compliance of an experimental relationship between tunnel current and control voltage, that is, signal characteristic of a molecular single-electronic transistor, with a theoretical relationship derived from the theory of single-electron electronics. Each period on signal characteristic is explained, in accordance with the "orthodox" theory of single-electron electronics, by a change of the cluster charge by one electron.

Symmetry of the signal characteristic, one the one hand, and the presence of steps in the voltage-current characteristic, on the other hand is explained by the fact that in the double-junction system "STM needle-cluster-substrate" the junctions "STM needle-cluster" and "cluster-substrate" have approximately the same capacitance values but differ widely in the values of their resistance.

According to the method for preparing a tunnel-effect device, an ordered molecular structure is established on a substrate in a system of planar metal (or semiconductor) electrodes, by fixing active molecules and clusters which provide for formation of tunneling junctions and a single-electron correlated electron tunneling in the device rather than a mere monolayer of inert molecules forming a dielectric interlayer, i.e., tunneling barrier.

Accordingly, when fixing such molecules and clusters, using the known Langmuir technique, a multicomponent combined monomolecular layer is established on water surface, said layer being constituted by inert amphiphilic molecules and active molecules and clusters forming single-electron tunneling junctions, whereupon the thus-formed multicomponent monomolecular layer from water surface onto the surface of the formed substrate.

When using chemical adsorption of molecules on the substrate surface for forming a system of single-electron tunneling junctions, active molecules and clusters should contain the corresponding chemical groups which bond said molecules and clusters with the substrate surface. Further on a chemical reaction of bonding the corresponding molecules and clusters with the substrate. Building of active molecules and clusters into the preformed molecular layer of inert molecules is also possible.

Once the mono- or multilayer molecular structures have been established, using the Langmuir-Blodgett technique or chemical adsorption procedure, the resultant molecular structures are made to polymerize with a view to increasing their stability and resistance to external effects.

Use of active molecules and clusters forming single-electron tunneling junctions, as the molecules establishing an ordered molecular structure on the surface of a solid-state substrate in a system of planar electrodes makes it possible to provide a novel useful property of the proposed device, that is, its functioning on the base of an single-electron correlated electron tunneling.

The herein-proposed tunnel-effect device is distinguished for the following advantages: the active elements of the device (molecules and clusters) have strictly fixed and identical structure (atomic composition) and hence dimensions. This provides for identity of the active elements of the devices and, accordingly, reproducibility of their functional parameters and the same response to a definite external effect.

INDUSTRIAL APPLICABILITY

The proposed tunnel-effect device is instrumental in developing digital and analog devices based on both the traditional concepts of circuitry construction and the quite new concepts of information coding, wherein individual electrons function as information carrying medium.

Active elements of the device (active molecules and clusters) are featured by extremely small dimensions (e.g., the molecule of a carboran cluster measures about 20 Å), which opens prospects for substantial miniaturization of single-electron devices developed with the use of said elements.

It is due to the use of molecules and clusters having nanometer dimensions as the active elements of the device that the characteristic dimensions of the active regions (single-electron tunneling junctions) of the device become small enough to provide a controlled single-electron correlated tunneling at relatively high (room) temperatures, and that an extremely high sensitivity of the device is attained at those temperatures towards changes in the charge on the active elements of the device ($\sim 10^{-5}$ e/Hz$^{1/2}$).

As distinct from the known tunnel-effect device functioning on the base of resonance tunneling, the proposed tunnel-effect device operates on the base of controlled single-electron correlated electron tunneling in a system of molecules or clusters having an arbitrary energy spectrum of electrons rather than resonance tunneling between quantum-mechanical wells with discrete energy levels. That is why no definite restrictions are imposed in the proposed device upon the structure of energy spectrum of electrons in molecules and clusters which establish single-electron tunnel junctions therein. As to the speed of response the proposed device is not inferior to the prototype, i.e., the device functioning on the effect of resonance tunneling. Energy release during electron tunneling in the proposed device is lower than in the known tunnel-effect devices. As distinct from the prototype, wherein no direct association is provided between the tunneling processes and the current measured on the output electrode, the tunneling current is directly registered in the proposed device.

Used as active elements in the proposed device are molecules or clusters (metal-containing ones inclusive) rather than semiconductor islands as in the prototype.

The herein-proposed tunnel-effect device functions on the base of controlled single-electron correlated electron tunneling. The phenomenon of single-electron correlated electron tunneling was theoretically predicted and described, and afterwards demonstrated experimentally. Possibility of controlling such tunneling current opens the way to constructing various electronic circuits on the base of single-electron tunneling junctions and hence to preparing single-electron analog and digital devices. Preparing such devices is very promising and important for further development of microelectronic engineering, since they operate on a new principle of information coding, consisting in that individual electrons perform the function of information carriers. Thus, such devices are featured by rather high speed characteristics. Theoretical assessment of the speed response corresponding to the dimensional parameters of the proposed device gives the value of $-3 \cdot 10^{-14}$ s, as well as the value of energy release during the process of a single-electron transfer equal to $-10^{-24}$ J. The principal concepts of constructing the circuitry analog and digital devices on the base of controlled single-electron tunneling are at present developed theoretically, though single-electron devices developed on the principle of the traditional solid-state planar technology are operable only at extremely low temperatures (<1 K). It follows from theory that in order that a single-electron device functions at room temperature, the characteristic dimensions of its active regions (that is, single-electron tunneling function) should be below 100 Å. However, the heretofore-known solid-state microelectronic technologies cannot at present (and probably in the nearest future) develop such devices reproducibly.

The method for making tunnel-effect devices having its active region measuring below 100 A initiated the development of devices of a new class, i.e., nanoelectronics. The effect of discrete tunneling of individual current carriers through tunneling barriers at room temperature used in the tunnel-effect device may also be applied in a single-electron transistor and used for constructing single-electron gate circuits, wherein logical "1" and "0" are identified with the presence or absence of an electron.

The effect of discrete single-electron tunneling used in tunnel-effect devices prepared by the proposed method allows of creating a quite number of analog and digital devices featuring different degrees of integration and very high performance characteristics.

The greatest prospects are offered in the development of very large-scale integrated circuits, wherein said devices can provide a combination of extremely low energy dissipation, very low dimensions of the devices themselves, and high seed characteristics, as well as in the development of new high-sensitivity sensors.

In summary, the tunneling device includes an input (3), an output (4) and control (N) electrodes separated by tunnel barriers. The tunnel barriers and inter-barrier spaces can take the form of a sequenced structure of molecules and clusters forming tunnel junctions, and each control electrode (5) is disposed in the region of the sequenced structure of molecules and clusters (2). The dimensions and characteristics of these molecules and clusters provide single-electron correlated tunneling of electrons in the device at relatively high (room) temperatures. The tunneling device is based on the principle of controllable correlated electron tunneling. The ability to control tunnel current opens up the possibility of constructing different electronic logical circuits based on single-electron tunneling junctions and creating single-electron analogue and digital devices, and in particular, highly sensitive sensors. A method for manufacturing the tunnelling device is as follows: input, output and control electrodes are formed on the surface of a solid-state substrate, an inert dielectric molecular matrix is then formed incorporating sequences of active molecules and clusters which act as localisation centers for tunnelling electrons and thus form single-electron tunnel junctions. The discrete tunnelling effect of single current carriers through the tunnel barriers at room temperature achieved in this tunnelling device can be used in a single-electron transistor and in the construction of single-electron logical circuits in which logical "1" and "0" is identified with the absence or presence of a single electron.

What is claimed is:

1. A tunnel-effect device comprising:
   an input electrode;
   an output electrode; and
   N control electrodes wherein said input, output, and control electrodes are separated with tunnel barriers, and wherein the tunnel barriers and an interbarrier space appear as an ordered structure of molecules and clusters forming tunneling junctions which provide for single-electron correlated electron tunneling in the device, each of the control electrodes being located in a region of the ordered structure of molecules and clusters wherein the input, output, and control electrodes are located on a surface of a solid-state substrate and wherein the substrate is made of graphite.

2. A tunnel-effect device as set forth in claim 1 wherein the input, output, and control electrodes are made of gold.

3. A method for preparing a tunnel-effect device comprising the steps of:
   forming an input, an output, and a control electrode on a surface of an atomically smooth solid-state substrate; and
   forming a monomolecular or multi-monomolecular film on the substrate wherein the monomolecular or multi-monomolecular film appears as an inert dielectric molecular matrix with fixedly built-in active molecules and clusters which are localization centers of tunneling electrons and establish single-electron tunneling junctions, N–1 control electrodes being additionally formed on the surface of the atomically smooth solid-state substrate wherein the inert dielectric molecular matrix with the active molecules and clusters built therein is established using a Langmuir-Blodgett technique.

4. A method for preparing a tunnel-effect device comprising the steps of:
   forming an input, an output, and a control electrode on a surface of an atomically smooth solid-state substrate; and
   forming a monomolecular or multi-monomolecular film on the substrate wherein the monomolecular or multi-monomolecular film appears as an inert dielectric molecular matrix with fixedly built-in active molecules and clusters which are localization centers of tunneling electrons and establish single-electron tunneling junctions, N–1 control electrodes being additionally formed on the surface of the atomically smooth solid-state substrate wherein molecules containing polymerizable chemical groups are used to establish the inert dielectric molecular matrix.

5. A method for preparing the tunnel-effect device as set forth in claim 4 wherein formation of the inert dielectric molecular matrix with fixedly built-in active molecules and clusters which are the localization centers of the tunneling electrons and establish single-electron tunneling junctions is followed by additional polymerization of the molecular structure.

6. A method for preparing a tunnel-effect device comprising the steps of:
   forming an input, an output, and a control electrode on a surface of an atomically smooth solid-state substrate; and
   forming a monomolecular or multi-monomolecular film on the substrate wherein the monomolecular or multi-monomolecular film appears as an inert dielectric molecular matrix with fixedly built-in active molecules and clusters which are localization centers of tunneling electrons and establish single-electron tunneling junctions, N–1 control electrodes being additionally formed on the surface of the atomically smooth solid-state substrate wherein the inert dielectric molecular matrix with fixedly built-in active molecules and clusters is established by the chemical adsorption technique.

7. A method for preparing the tunnel-effect device as set forth in claim 6 wherein molecules containing polymerizable chemical groups are used for establishing the inert dielectric molecular matrix.

8. A method for preparing the tunnel-effect device as set forth in claim 7 wherein formation of the inert dielectric molecular matrix with fixedly built-in active molecules and clusters which are the localization centers of the tunneling electrons and establish single-electron tunneling junctions is followed by additional polymerization of the molecular structure.

9. A tunnel-effect device comprising:
   a substrate having a face;
   an input electrode on said face of said substrate;
   an output electrode on said face of said substrate and spaced apart from said input electrode;
   at least one control electrode on said face of said substrate and spaced apart from said input and output electrodes; and
   a dielectric molecular matrix on said substrate separating said input, output, and control electrodes wherein said dielectric molecular matrix provides localization centers for tunneling electrons to form single-electron tunnel junctions between said input and output electrodes wherein said substrate comprises graphite.

10. A tunnel-effect device according to claim 9 wherein said dielectric molecular matrix comprises a plurality of molecular clusters chosen from the group consisting of organo-metallic clusters, carboran clusters, and fulleren clusters.

11. A tunnel-effect device according to claim 10 wherein each of said clusters has a size of less than 100 Angstroms.

12. A tunnel-effect device according to claim 11 wherein each of said clusters has a size of approximately 20 Angstroms.

13. A tunnel-effect device according to claim 11 wherein each of said clusters has approximately the same dimensions.

14. A tunnel-effect device according to claim 9 wherein each of said input electrode, said output electrode, and said control electrode comprises gold.

15. A tunnel-effect device according to claim 9 wherein each of said electrodes is separated from said substrate by a respective dielectric layer.

16. A tunnel-effect device according to claim 15 wherein said dielectric layer comprises aluminum oxide.

17. A tunnel-effect device comprising:
   a substrate having a face;
   an input electrode on said face of said substrate;

an output electrode on said face of said substrate and spaced apart from said input electrode;

at least one control electrode on said face of said substrate and spaced apart from said input and output electrodes;

a dielectric molecular matrix on said substrate separating said input, output, and control electrodes wherein said dielectric molecular matrix provides localization centers for tunneling electrons to form single-electron tunnel junctions between said input and output electrodes; and a second control electrode spaced apart from said first control electrode, said input electrode, and said output electrode.

18. A method of forming a tunnel-effect device, said method comprising the steps of:

forming an input electrode on a face of a substrate;

forming an output electrode on said face of said substrate and spaced apart from said input electrode;

forming at least one control electrode on said face of said substrate spaced apart from said input and output electrodes; and forming a dielectric molecular matrix on said substrate separating said input, output, and control electrodes wherein said dielectric molecular matrix provides localization centers for tunneling electrons to form single-electron tunnel junctions between said input and output electrodes wherein said dielectric molecular matrix comprises molecules containing polymerizable chemical groups.

19. A method according to claim 18 wherein said step of forming said dielectric molecular matrix is followed by the step of polymerizing said dielectric molecular matrix.

20. A method according to claim 18 wherein said dielectric molecular matrix comprises a plurality of molecular clusters chosen from the group consisting of organo-metallic clusters, carboran clusters, and fulleren clusters.

21. A method according to claim 18 wherein each of said input electrode, said output electrode, and said control electrode comprises gold.

22. A method according to claim 18 wherein each of said electrodes is separated from said substrate by a respective dielectric layer.

23. A method according to claim 22 wherein said dielectric layer comprises aluminum oxide.

24. A method according to claim 20 wherein each of said clusters has a size of less than 100 Angstroms.

25. A method according to claim 24 wherein each of said clusters has a size of approximately 20 Angstroms.

26. A method according to claim 24 wherein each of said clusters has the same dimensions.

27. A method of forming a tunnel-effect device, said method comprising the steps of:

forming an input electrode on a face of a substrate;

forming an output electrode on said face of said substrate and spaced apart from said input electrode;

forming at least one control electrode on said face of said substrate spaced apart from said input and output electrodes; and forming a dielectric molecular matrix on said substrate separating said input, output, and control electrodes wherein said dielectric molecular matrix provides localization centers for tunneling electrons to form single-electron tunnel junctions between said input and output electrodes wherein said step of forming said dielectric molecular matrix comprises forming a Langmuir-Blodgett dielectric molecular matrix.

28. A method of forming a tunnel-effect device, said method comprising the steps of:

forming an input electrode on a face of a substrate;

forming an output electrode on said face of said substrate and spaced apart from said input electrode;

forming at least one control electrode on said face of said substrate spaced apart from said input and output electrodes; and forming a dielectric molecular matrix on said substrate separating said input, output, and control electrodes wherein said dielectric molecular matrix provides localization centers for tunneling electrons to form single-electron tunnel junctions between said input and output electrodes wherein said step of forming said dielectric molecular matrix comprises chemical adsorption.

29. A method of forming a tunnel-effect device, said method comprising the steps of:

forming an input electrode on a face of a substrate wherein said substrate comprises graphite;

forming an output electrode on said face of said substrate and spaced apart from said input electrode;

forming at least one control electrode on said face of said substrate spaced apart from said input and output electrodes; and forming a dielectric molecular matrix on said substrate separating said input, output, and control electrodes wherein said dielectric molecular matrix provides localization centers for tunneling electrons to form single-electron tunnel junctions between said input and output electrodes.

30. A method of forming a tunnel-effect device, said method comprising the steps of:

forming an input electrode on a face of a substrate;

forming an output electrode on said face of said substrate and spaced apart from said input electrode;

forming at least one control electrode on said face of said substrate spaced apart from said input and output electrodes; and forming a dielectric molecular matrix on said substrate separating said input, output, and control electrodes wherein said dielectric molecular matrix provides localization centers for tunneling electrons to form single-electron tunnel junctions between said input and output electrodes a second control electrode spaced apart from said first control electrode, said input electrode, and said output electrode.

* * * * *

UNITED STATES PATENT AND TRADEMARK OFFICE
CERTIFICATE OF CORRECTION

PATENT NO.     :   6,057,556
DATED          :   May 2, 2000
INVENTOR(S)    :   Sergei Pavlovich Gubin; Vladimir Vladimirovich Kolesov;

Evgenii Sergeevich Soldatov; Artem Sergeevich Trifonov; Vladimir Viktorovich Khanin, Genadii Borisovich Khomutov; Sergei Aleksandrovich Yakovenko It is certified that error appears in the above-identified patent and that said Letters Patent is hereby corrected as shown below:

Column 1, line 35 correct "With" to read --with--.

Column 2, line 21 correct "or" to read --for--.

Column 4, line 58 correct "defer" to read --differ--.

Column 5, line 46 correct "MODE" to read --METHOD--.

Column 5, line 52 correct "mixing" to read --fixing--.

Column 7, line 21 correct "or" to read --of--.

Column 12, line 26 correct "function" to read --junction--.

Column 12, line 48 correct "seed" to read --speed--.

Signed and Sealed this

Twenty-fourth Day of April, 2001

Attest:

NICHOLAS P. GODICI

*Attesting Officer*     *Acting Director of the United States Patent and Trademark Office*